(12) United States Patent
van Ee et al.

(10) Patent No.: US 6,208,341 B1
(45) Date of Patent: Mar. 27, 2001

(54) GUI OF REMOTE CONTROL FACILITATES USER-FRIENDLY EDITING OF MACROS

(75) Inventors: Jan van Ee, San Jose, CA (US); Paul S. Moore; Guy J. Roberts, both of Eindhoven (NL)

(73) Assignee: U. S. Philips Corporation, New York, NY (US)

( * ) Notice: Subject to any disclaimer, the term of this patent is extended or adjusted under 35 U.S.C. 154(b) by 0 days.

(21) Appl. No.: 09/129,300

(22) Filed: Aug. 5, 1998

(51) Int. Cl.[7] ........................................................ G06F 3/00
(52) U.S. Cl. ........................ 345/339; 345/326; 345/173; 345/352; 345/335; 345/327
(58) Field of Search ........................ 345/970, 326, 345/339, 173, 168, 968, 352, 335, 356, 327

(56) References Cited

U.S. PATENT DOCUMENTS

| 5,231,381 | | 7/1993 | Duwaer | 345/174 |
|---|---|---|---|---|
| 5,402,151 | | 3/1995 | Duwaer | 345/173 |
| 5,410,326 | * | 4/1995 | Goldstein | 348/734 |
| 5,734,853 | * | 3/1998 | Hendricks et al. | 345/352 |
| 5,745,116 | * | 4/1998 | Pisutha-Arnond | 345/358 |
| 5,767,458 | | 6/1998 | Koolen | 178/18.01 |
| 5,767,919 | * | 6/1998 | Lee et al. | 348/569 |
| 5,777,607 | | 7/1998 | Koolen | 345/174 |
| 5,822,123 | * | 10/1998 | Davis et al. | 348/564 |
| 5,898,398 | * | 4/1999 | Kumai | 341/176 |

OTHER PUBLICATIONS

Software Upgrade Booklet for the DVX8000 Multimedia Home Theater of Philips Electronics, pp. 25–31.
User Guide 206W851260 for the RC2000MkII model, pp. 22–32.
Nov. 1996 issue, pp.40–42 of the magazine "Home Theater".
Winter 1996 issue, pp. 123–126, of the magazine "Home Theater".

* cited by examiner

Primary Examiner—Raymond J. Bayerl
Assistant Examiner—Cuong T. Thai
(74) Attorney, Agent, or Firm—Peter Verdonk

(57) ABSTRACT

A remote control device for a home theater has a macro creation/editing mode with authoring tools on the remote's GUI. One of the editing tools lets the user move a selected macro step visibly up or down the list of steps on the GUI.

5 Claims, 4 Drawing Sheets

GUI OF REMOTE CONTROL FACILITATES USER-FRIENDLY EDITING OF MACROS

FIELD OF THE INVENTION

The invention relates to a handheld remote control device for control of electronic equipment, in particular for control of home theater equipment. The device has a program mode that enables the user to create macro's.

BACKGROUND ART

Examples of a state of the art programmable remote control device are the RC2000 and RC2000MkII, both of Marantz, a subsidiary of Philips Electronics. These devices have the ability to learn commands for typical control functions, and to associate a respective one of the device's buttons with a respective one of the commands learned. The devices can also be programmed to store macros. A macro is a string of commands that describe a series of specific steps to be carried out in sequence. A macro is assigned to a particular button. After the device is put into the macro-creation mode, the user must enter the sequence of steps to be carried out under the macro. Entering a step corresponds to pressing one of the buttons that have already been programmed for a single command. The device has a GUI that gives the user visual feedback during programming. A GUI is an interactive user-interface with graphical representations.

For more information on the operation of the Marantz device see, e.g., the Software Upgrade Booklet for the DVX8000 Multimedia Home Theater of Philips Electronics, pages 25–31, and the User Guide 206W851260 for the RC2000MkII model, pages 22–32, herein incorporated by reference.

For more information on programming of universal remote controls see, for example, U.S. patent application Ser. No. 08/907,284, now allowed, of Philips Electronics, and herein incorporated by reference.

OBJECT OF THE INVENTION

The user can program a macro on the known devices and store it under any of four hard keys. A macro hard key can be programmed to store up to 20 steps. Revising of a programmed macro can be done in several ways: by overwriting one or more steps already entered, inserting a step at a specific position in the sequence, or deleting a step entered previously. The Marantz RC2000 remote control device has been welcomed enthusiastically in the home theater world. See, for example, the November 1996 issue, pp.40–42, and the winter 1996 issue, pp. 123–126, of the magazine "Home Theater". However, programming the known devices is not that simple and requires an effort well beyond that what the average consumer is willing to spend. An object of the invention is therefore to improve upon the user-friendliness of the known universal remote control devices, especially those for operating a consumer environment such as a home theater.

SUMMARY OF THE INVENTION

To this end, the invention provides a remote control device for control of electronic equipment. The remote has a display for display of a GUI with a plurality of user-selectable options. The remote enables the user to program a macro. The macro comprises a sequence of multiple ones of the control options of the GUI. The GUI enables the user to view the sequence as a scrollable list of steps. The GUI enables the user to edit the list by selecting at least one specific one of the steps and moving it up or down the list.

In this manner, the user can, if so desired, create any permutation of the sequence in an intuitive fashion. Preferably, the remote of the invention has the control options organized in a hierarchy of panels for individual display on the GUI. The user can program a macro that has one or more steps that lets the GUI jump to one or more specific ones of the panels during execution of the macro. This approach lets the user intervene with the macro execution or manually add steps during execution of an individual macro. However, it may be more convenient to have the jump to a specific panel as the last step in the macro. Preferably, the remote has a touch screen for enabling user-selection of the options. All major user control functions can thus be presented through graphical representations clustered in a logical or intuitive manner, not displaying more than what is necessary at the moment of interaction with a particular panel setting the context.

In the preferred embodiment, the remote according to invention allows its users to create an arbitrary number of macros with each up to 255 steps. Each step or action can be an IR (or RF) code, a 0.1 to 99.9 second delay, a reference to any other button, key or apparatus listed on the remote's GUI or a jump to any panel of the GUI. The user can create a macro by pushing a sequence of buttons and keys. The device records the sequence in the order of the steps entered. Afterwards, the user can view the macro as a scrollable list of steps, add more steps, select and delete steps, select and move steps up or down the macro, and select and adjust the value of delay steps. The visual feedback and editing capabilities are believed to be unique for an AV remote control. The remote for a home theater is thus provided with a macro creation/editing mode that has authoring tools accessible via the remote's GUI. One of the editing tools lets the user move a selected macro step visibly up or down the list of steps on the GUI. This authoring tool in the remote of the invention greatly improves the ergonomic character and user-friendliness and is believed to eventually support wider acceptance of home theater equipment.

BRIEF DESCRIPTION OF THE DRAWINGS

The invention is explained by way of example and with reference to the accompanying drawings, wherein.

Throughout the figures, same reference numerals indicate similar or corresponding features.

PREFERRED EMBODIMENTS

Figure 1:
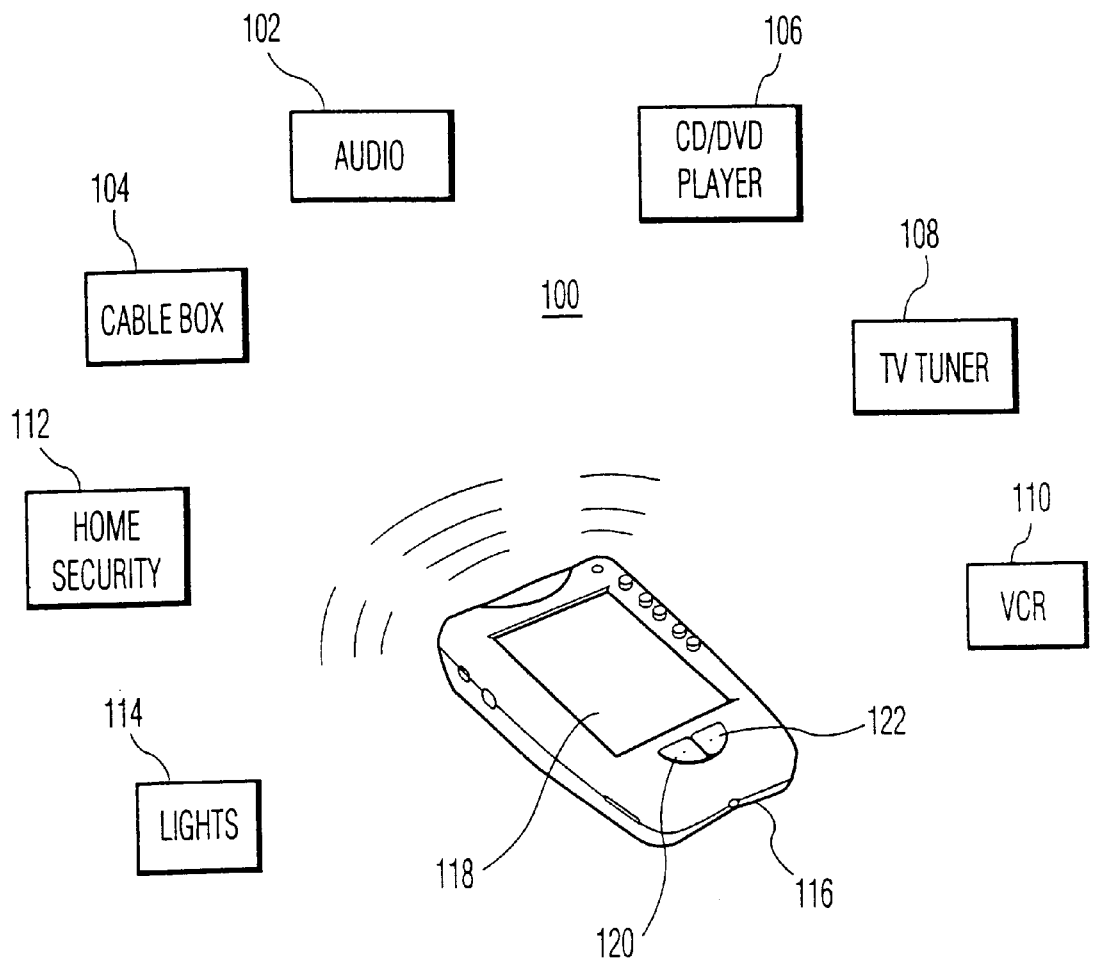
FIG. 1 is a block diagram of a home theater system.

FIG. 1 is a block diagram of a home theater system 100. The system comprises, for example, the following pieces of consumer equipment: an audio amplifier 102; a cable-TV box 104; a CD/DVD player 106; a TV tuner 108; a VCR 110; a home security system 112, a lighting control system 114 for control of luminaires (not shown) and a remote control device 116. Equipment 102–114 is capable of being controlled by, in this example, IR commands (alternatively or subsidiarily RF commands). Remote 116 is capable of controlling it all through issuing the proper IR commands. Remote 116 has also the capability of being programmed for a macro instruction that is being executed upon a single user-interaction with remote 116. For example, the user can program a macro that first turns on home security system 112, then audio processor 102, after this turns on CD player 106, further shows on remote 116 the panel for adjusting the volume of the music, thereafter selects a particular piece of music based on the content available from a CD carousel (not shown), and shows on remote 116 the panel for setting the lighting of the room at a desired level and finally let the GUI of remote 116 return to a home panel. In the invention, remote 116 allows its users to program adjustable time delays in the macro, for example, a delay of 10 seconds for the user to select the desired sound volume in the above example. User-intervention during execution of the macro is an option. It may, however, be more convenient to have as a last step of the macro a jump to a specific control panel, or simply the home panel of remote control device 116.

Remote control device 116 has a GUI 118 on a display, e.g., an LCD, that has a touch screen functionality, e.g., a resistive tablet. Remote 116 further has hard keys 120 and 122. The GUI has user-selectable menu options that are organized in various panels and sections of panels. A panel is, for example, a cluster of soft keys displayed together. The major user-selectable options for control of system 100 are provided as soft-keys in GUI 118. Hard keys 120 and 122 are programmed so as to provide quick user-control dependent on the operational mode of remote 116. For example, left-hand key 120 is mapped onto the "Stop" function when remote 116 is set into any mode for control of a transport functionality of equipment that is supplying video and/or audio output, e.g., VCR 110 or DVD player 106, and right-hand key 122 is mapped onto the corresponding "Play" function.

Figure 2:
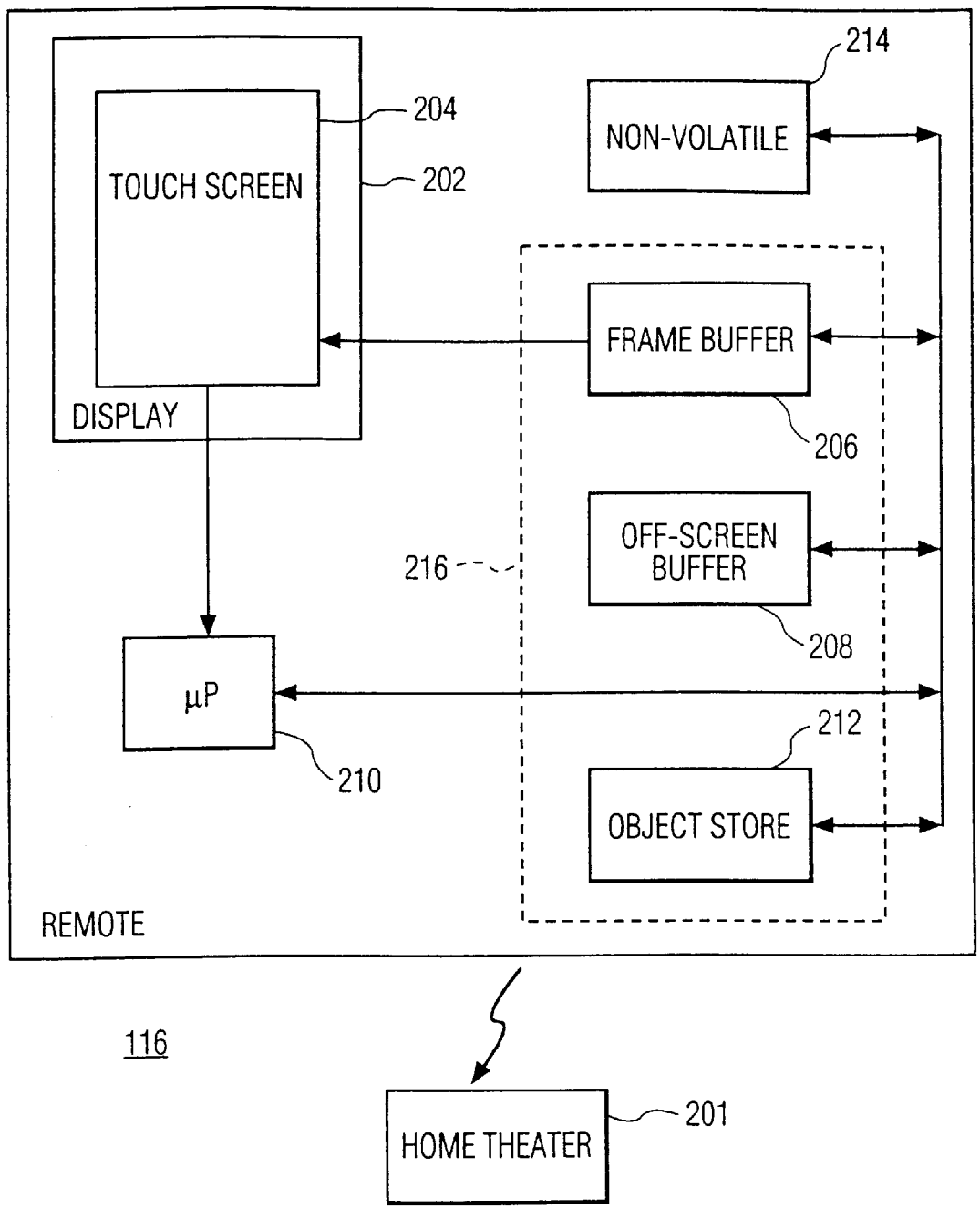
FIG. 2 is a diagram of a remote control device.

FIG. 2 is a block diagram of remote control device 116 for control of home theater equipment 201 through a wireless protocol in IR or RF. Remote 116 comprises a display 202 for display of GUI 118 and a touch screen 204 for activating a user-selectable option of GUI 118. Display 202 comprises an LCD. Touch screen 204 is, for example, a resistive tablet. For more background on such input devices, see, for example, U.S. Pat. Nos. 5,402,151; 5,231,381; 5,777,607 and 5,767,458 of Philips Electronics, all incorporated herein by reference. In the preferred embodiment, LCD 202 and touch screen 204 are physically integrated, and the combination has screen dimensions of about 77×58 mm for the active area, and about 81×62 mm for the visible area. The screen resolution is about 4 pixels per mm. Remote 116 comprises a frame buffer 206, an off-screen memory 208, a microprocessor 210, an object store 212 and a non-volatile memory 214. Frame buffer 206 is coupled to display 202 and stores the information content shown on display 202. Off-screen buffer 208 stores bitmaps that are mapped into frame buffer 206 under control of a software bitblitter run on microprocessor 210. Microprocessor 210 receives user-input via touch screen 204 and translates the input into associated GUI actions via framebuffer 206 and off-screen buffer 208. Object store 212 lists the information to be rendered in off-screen buffer 208 and/or in frame buffer 206 by microprocessor 210. The information is stored in object store 212 as objects. Non-volatile memory 214 stores data files that describe the macro's and the individual macro steps. This description is in a universal format, e.g., <"type of action"; "parameters">, so that it can be interpreted platform-independently. Interpretation creates objects, e.g., in C++, for object store 212. In the preferred embodiment, processor 210 is a MC68328 of Motorola. Buffers 206 and 208, together with object store 212 are implemented in an SRAM 216 such as a 512 kbyte SRAM, e.g., a KM616Y4000BLT-7L of Samsung. Non-volatile memory 214 is, for example, a 1 Mbyte flash memory T E28F800B3B90 of Intel.

Figure 3:
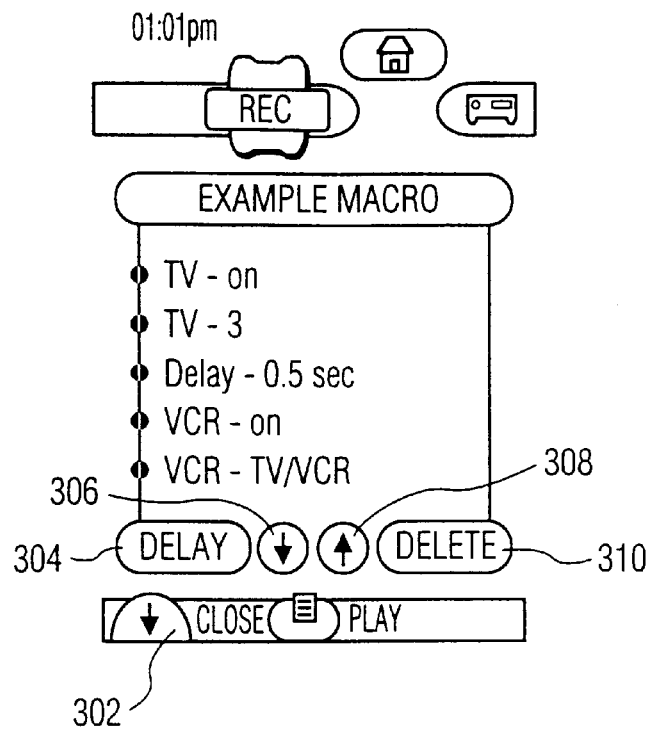
FIGS. 3–6 are diagrams of the GUI of the remote when the user edits a macro.
Figure 4:
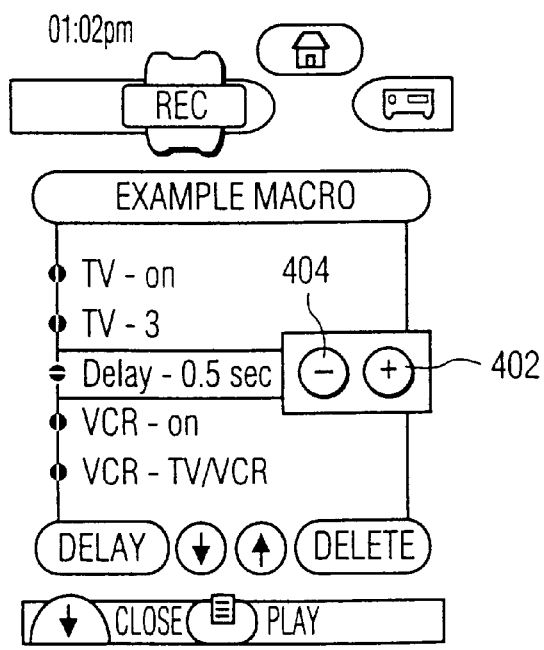
Figure 5:
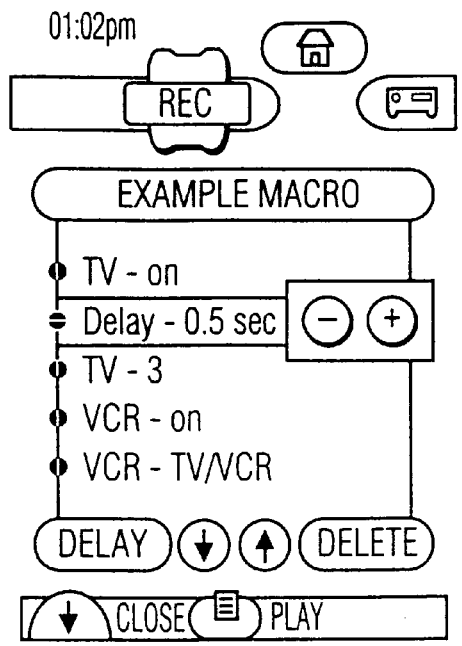
Figure 6:
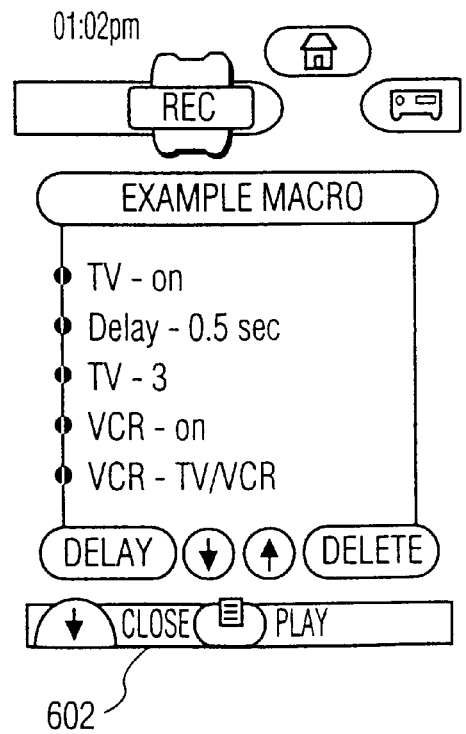

FIGS. 3–6 illustrate the GUI of remote 116 in the macro editing mode for recording on the VCR a TV program. The GUI shows a portion of a recorded macro with the following steps: "TV-on" (turn on the TV); "TV-3" (select channel 3); "Delay—0.5 sec" (wait for 0.5 seconds before issuing the next command); "VCR-on" (turn the VCR on); and "VCR-TV/VCR" (use the TV as source for the VCR). The GUI provides tools for editing the macro such as a scroll key 302, a delay key 304, arrow keys 306 and 308, and a delete key 310. Tapping touch screen 204 at the location of a specific one of the steps shown selects this step for further operations. Scroll key 302 lets the user scroll the macro to bring into view further steps of the macro under consideration. Touching delay key 304 insert a delay into the macro. The delay step is added, for example, at the end of the macro. Arrow keys 306 and 308 move a selected step down or up the sequence of the macro. Key 310 deletes a selected step. In order to add a new command, the user has to go to an other panel of the GUI, e.g., the apparatus controls (not shown here) and enter the command with remote 116 in the macro creation mode. The new command is added to the sequence, e.g., at the end, and can be repositioned by selecting and arrow keys 306 and 308. Other procedures can be implemented to insert the new command at the proper position. The example of FIGS. 3–6 illustrates how a macro is edited that has already been programmed. In the example, the step "Delay—0.5 sec" in FIG. 3 is selected by tapping on it. The GUI in FIG. 4 shows that the selected step is highlighted. In addition, delay control keys 402 and 404 pop up. Keys 402 and 404 are used to increase or decrease the length of the delay. The GUI in FIG. 5 shows the selected delay step moved up one step the sequence by use of arrow key 308. The GUI in FIG. 6 shows the re-positioned delay step, now with an increased delay of 5.0 sec. instead of 0.5 sec. through use of key 402. Tapping a "CLOSE" key 602 closes the macro and causes the GUI to return to the use-mode after writing the macro to flash memory 214.

When the user puts remote 116 into the macro editing mode and selects a particular macro, the corresponding data are retrieved from flash memory 214, interpreted by processor 210, the resulting objects stored in SRAM 216, and converted to one or more bitmaps that get displayed on display 202. If the editing of the macro does not add more steps, the data for the edited macro is saved and stored at the addresses in flash memory 214 that held the previous version. If the editing leads to a longer sequence, the macro data is stored at new addresses in flash memory, and reference to the previous addresses is rendered invalid. Garbage collection can be used to delete data that are not used.

I claim:

1. A remote control device for remote control of equipment, the device having a display for display of a GUI with a plurality of user-selectable options, wherein:

the device enables the user to program a macro comprising a sequence of multiple ones of the control options;

the GUI enables the user to view the sequence as a scrollable list of steps;

the GUI enables the user to edit the list by selecting at least one specific one of the steps at a first location in the list, moving the specific step along the sequence, and inserting the specific step into a second location of the list.

2. The device of claim 1, wherein:

the control options are organized in two or more panels for individual display on the GUI; and the device enables the user to program the macro comprising a particular step that causes the GUI to jump to a specific one of the panels.

3. The device of claim 1, wherein the device has a touch screen for enabling user-selection of the options.

4. The device of claim 1, wherein the GUI changes its appearance through animation upon selection of a particular one of the user-selectable options.

5. The device of claim 1, wherein the macro is programmable to be activated under a softkey on the GUI.

* * * * *